United States Patent [19]

Anderson

[11] Patent Number: 4,996,599
[45] Date of Patent: Feb. 26, 1991

[54] TELEVISION TUNER OSCILLATOR WITH THREE POINT TRACKING

[75] Inventor: William D. Anderson, Fox River Grove, Ill.

[73] Assignee: RCA Licensing Corporation, Princeton, N.J.

[21] Appl. No.: 339,576

[22] Filed: Apr. 14, 1989

[51] Int. Cl.$^5$ .......................... H04N 5/50; H04B 1/26; H03J 1/10
[52] U.S. Cl. ................................ 358/191.1; 455/195; 455/197
[58] Field of Search ...................... 358/191.1; 455/195, 455/197; 334/15

[56] References Cited

U.S. PATENT DOCUMENTS

| | | | |
|---|---|---|---|
| 3,628,152 | 12/1971 | Carlson | 325/383 |
| 3,825,858 | 7/1974 | Amemiya et al. | 331/117 |
| 3,962,643 | 6/1976 | Ma | 325/464 |
| 4,023,106 | 5/1977 | Utsunomiya | 325/462 |
| 4,271,529 | 6/1981 | Strammello, Jr. | 455/180 |
| 4,288,875 | 9/1981 | Carter | 455/197 |
| 4,334,323 | 6/1982 | Moore | 455/179 |
| 4,339,559 | 8/1983 | Theriault | 334/15 X |
| 4,363,135 | 12/1982 | Moon | 455/180 |
| 4,404,686 | 9/1983 | Moon | 455/191 |
| 4,442,548 | 4/1984 | Lehmann | 455/197 X |
| 4,601,062 | 7/1986 | Hettiger | 455/285 |
| 4,607,391 | 8/1986 | Matsuda | 455/188 |
| 4,628,540 | 12/1986 | Hendricks | 455/197 |
| 4,703,286 | 10/1987 | Muterspaugh | 455/195 X |
| 4,743,866 | 5/1988 | Muterspaugh | 331/117 |
| 4,783,849 | 11/1988 | Muterspaugh | 455/197 |
| 4,837,852 | 6/1989 | Takada et al. | 455/197 |

OTHER PUBLICATIONS

Electronic Designers' Handbook by Landee, Davis and Albrecht, 1957, McGraw-Hill Book Company, pp. 7-84, and 7-85.
Radiotron Designer's Handbook by Smith, 1965, Radio Corporation of America, pp. 1002 and 1003.
Radio Engineers' Handbook by Terman, 1943, McGraw-Hill Book Company, p. 649.

Primary Examiner—James J. Groody
Assistant Examiner—Mark R. Powell
Attorney, Agent, or Firm—Joseph S. Tripoli; Peter M. Emanuel; Frederick A. Wein

[57] ABSTRACT

The present invention concerns apparatus for changing the effective tuning inductance with a change of frequency of a multi-band oscillator, said frequency being controlled in response to the magnitude of a tuning voltage for tuned signal amplifiers so that three point tuning can be achieved in the lowest frequency band between the signal amplifiers and the oscillator. In accord with the present invention, a reactance network is connected in series with the tuning inductor of the lowest band for tailoring the tracking of the oscillator frequency with change of tuning voltage.

11 Claims, 2 Drawing Sheets

TELEVISION TUNER OSCILLATOR WITH THREE POINT TRACKING

The present invention concerns a multi-band oscillator for use in television receiving apparatus and the like with an extended frequency range for achieving three point tracking on all of the bands.

Voltage controlled tuners are widely employed in television receivers. They include the RF input section and a local oscillator, each including respective frequency selective circuitry controlled in response to a tuning voltage. In response to the tuning voltage, the RF input section selects one of a plurality of received RF carriers corresponding to a selected station and the local oscillator generates a local oscillator signal having a predetermined frequency associated with the selected channel. The selected RF carrier and local oscillator signal are hetrodyned by a mixer to produce an IF signal which, in a television receiver, is processed by the IF stages to produce audio and visual responses.

The television range includes several separate frequency bands. The present U.S. television signal spectrum for very high frequency (VHF) and cable television network (CATV) channels (excluding the broadcast UHF channels of channels 14-83 from 470 MHz to 890 MHz) can be divided into three bands extending between 54-88 MHz and including VHF channels 2-6, a high/mid VHF band extending between 120-216 MHz and including CATV channels A-I and VHF channels 7-13, and a CATV band extending between 216-300 MHz and including CATV channels J-W.

Typically, the frequency selective circuitry includes a plurality of tunable resonant circuits each comprising a voltage-controlled variable capacitance diode commonly called a varactor diode, and an arrangement of inductors connected therewith forming in combination at least one fixed inductor. The capacitance range of the varactor diodes are not, in general, large enough to enable the tuned circuit to be tuned over the entire VHF range. As a result, it is typical that the tuned circuits in the RF section and local oscillator of a voltage controlled television tuner each include circuitry for selecting, using switching diodes, a different inductor configuration for each of the VHF and CATV bands.

Typically, for a three band tuner, a pair of band switching diodes are operative in response to a suitable bandswitching signals for coupling three different combinations of inductors with the varactor diode to achieve a different resonant condition for tuning each of the three different bands.

One problem in a superhetrodyned receiver is the maintaining of a constant frequency difference (equal to the intermediate frequency) between the signal circuits, such as the RF stages, and the local oscillator circuit. Oscillator circuits must be arranged so that for all tuning adjustments, that the difference between resonant frequencies of the RF and oscillator tuned circuits closely approximates the intermediate frequency. Since the tuning of the local oscillator circuit ordinarily tracks the tuning of the RF circuits, the local oscillator must tune over either a greater or smaller percentage of its center frequency than the RF circuits, depending upon whether the local oscillator is tuned below or above the signal frequency. By the proper combination of oscillator circuit components it is possible to achieve close tracking within a particular band at three frequencies. If the three frequencies at which the local oscillator tuning is correct are selected so that two are near the ends of the receiver tuning range for a particular band and the third frequency is near the arithmetic or geometric mean of the frequency band, the maximum values of deviation above and below the exact frequency will be nearly equal and of minimum value. Achieving three point tracking thus requires tailoring the frequency tuning curve with respect to the varactor tuning voltage in order for the change of frequency vs change in tuning voltage to coincide for the various circuits over the various bands.

Establishing the tracking curve of change of frequency vs. change in tuning voltage can be difficult because of the criticality of the conditions that must be established for oscillation to occur. An oscillator includes an amplifier with a frequency determining network and a feedback path between the output and the input of the amplifier configured to form a regenerative amplification network (positive feedback) at desired frequencies determined by the frequency determining network. Typically the voltage controlled oscillators utilized in a television receiver include a transistor amplifier and a frequency determining network comprising an inductor and a varactor diode in either a series or parallel configuration.

In fact, the individual elements of the oscillator are complex, inducing resistive, capacitive, and inductive components. As the frequency of oscillation is changed, the relationship between the various components changes, causing the conditions for oscillation to be disturbed. For example, as the capacitance of a varactor diode increases with a decreased tuning voltage applied across its anode and cathode terminals, its reactive component at a particular frequency is decreased thus permitting the resistive component to be more closely coupled with and effect other components of the oscillator. This may manifest itself as loss causing the reduction of the amplitude of signal available to be fed back between amplifier output and input as well as change of phase of the fed-back signal causing possible detuning.

SUMMARY OF THE INVENTION

Briefly, the present invention concerns apparatus for changing the effective tuning inductance with a change of frequency of a multi-band oscillator, said frequency being controlled in response to the magnitude of a tuning voltage for tuned signal amplifiers so that three point tuning can be achieved in the lowest frequency band between the signal amplifiers and the oscillator. In accord with the present invention, a reactance network is connected in series with the tuning inductor of the lowest band for tailoring the tracking of the oscillator frequency with change of tuning voltage.

DESCRIPTION OF THE DRAWINGS

For a better understanding of the present invention, reference may be had to the accompanying drawings wherein.

DETAILED DESCRIPTION OF THE PREFERRED EMBODIMENT

Figure 1:
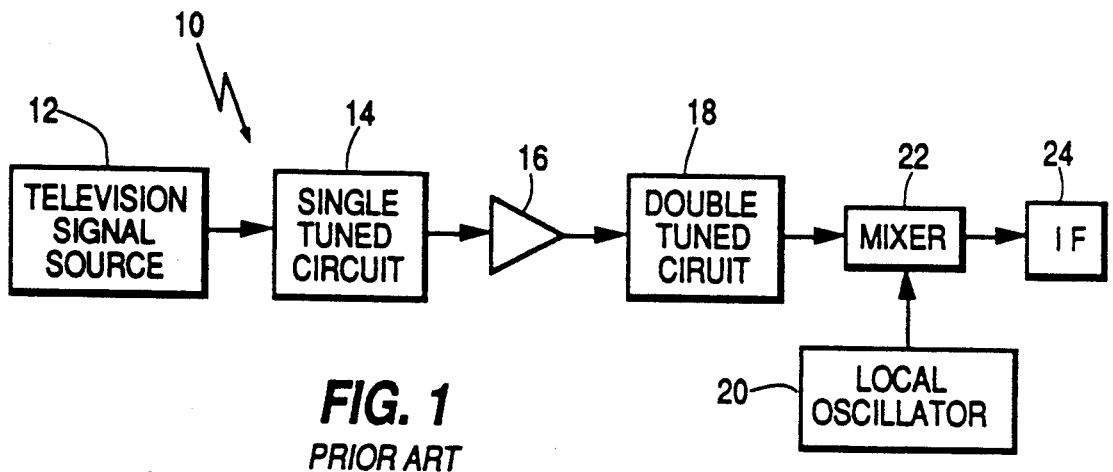
FIG. 1 is a block diagram representation of a television receiver tuner as known in the prior art which may utilize aspects of the present invention.

Referring now to the drawings wherein like reference numerals have been applied to like members, there is shown in FIG. 1 in block diagram form, an exemplary tuning system for selectively tuning a television receiver to any channel within, e.g., the VHF and CATV frequency bands. A VHF tuning section, generally designated 10, receives RF signals from a signal source 12 such as an antenna or cable network and couples the received RF television signal to a varactor voltage controlled single-tuned filter circuit 14. The RF signal is then amplified by an RF amplifier 16 with the output of amplifier 16 typically coupled through an additional varactor voltage controlled double tuned filter circuit 18. The varactor controlled filter circuits 14 and 18 select a channel out of the many channels received from the signal source 12.

A voltage controlled VHF local oscillator 20 is varactor tuned and generates a local oscillator signal having a predetermined fixed frequency typically higher than the center frequency of the selected channel so that the difference between of the frequencies of the local oscillator signal and the selected channel will be the predetermined intermediate frequency (IF) of the system. The selected RF signal and the local oscillator signal are applied to a mixer 22 where they are hetrodyned to generate an IF signal. The IF signal is filtered and amplified by an IF section 24 and then applied to a picture and sound signal processing section (not shown).

To enable the entire frequency range to be tuned, single tuned filter circuit 14, double tuned filter circuit 18, and local oscillator 20 include different tuned circuit configurations for each of the low VHF band, the high VHF band. and CATV band. Specifically, the tuned circuit(s) each include a varactor diode(s) in essentially a parallel combination with a different inductor configuration selected in response to respective ones of band selection signals.

Figure 2:
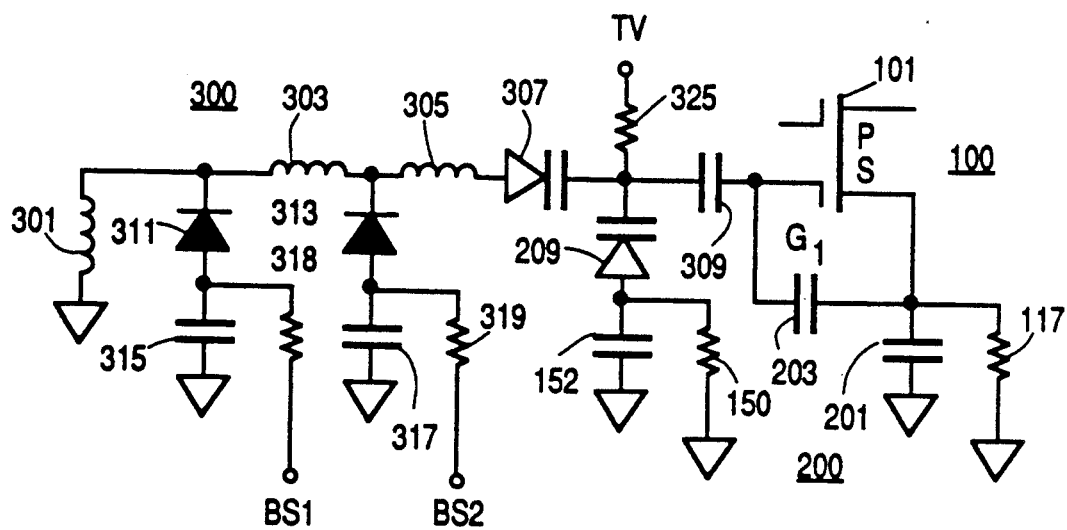
FIG. 2 is a schematic diagram of the pertinent part of a prior art oscillator of FIG. 1.

Referring now to FIG. 2 there is shown a prior art local oscillator circuit. The circuit of FIG. 2 is a schematic of the pertinent part of the oscillator disclosed in FIG. 1 of U.S. Pat. No. 4,743,866 of Muterspaugh, assigned to the predecessor in interest of the assignee of the present application, and is expressly incorporated by reference herein. Reference should be had to the pertinent part of the above stated patent for a detailed operation of the circuit of FIG. 2 wherein members have been given numeral designations corresponding with the numeral designations of like members of FIG. 1 in the above referenced U.S. Patent.

Briefly however, an amplifier circuit, generally designated 100 includes a dual gate N channel metal oxide semiconductor (MOS) field effect transistor (FET) 101. A circuit 200 conditions amplifier 100 to oscillate, is coupled between the output of source (S) and the input to the first gate electrode (G1), and includes a capacitor 201 connected in shunt with resistor 117 between the source electrode (S) and signal ground with a capacitor 203 connected between the source electrode (S) and the first gate electrode (G1) for forming a Colpitts type oscillator.

Briefly, a circuit 300 is a series tuned circuit which includes inductors 301, 303 and 305, and a varactor diode 307 coupled in series with a DC blocking capacitor 309. Bandswitching diodes 311 and 313 and associated bypass capacitors 315 and 317, respectively, selectively bypass the circuit points intermediate inductors 301 and 303, and inductors 303 and 305 respectively, to ground in accordance with the levels of bandswitching voltages BS1 and BS2. Varactor diodes 307 and 209 are poled with respect to the tuning voltage (TV) so that the capacitances they exhibit change in the same sense in response to changes in the magnitude of the tuning voltage. Resistor 150 provides a DC return for varactor 209 and capacitor 152 AC grounds the cathode of varactor 209.

In the lowest band 1, the series inductors 301, 303, and 305 form the inductance of the resonant circuit. For three point tracking it is necessary to tailor the tuning rate of change of the oscillator vs tuning voltage at the low frequency end as discussed hereinabove. This tailoring has proved to be difficult. The difficulties were overcome by network 400 of FIG. 3 wherein members have been designated with like numerals corresponding to like members of FIG. 2.

Figure 3:
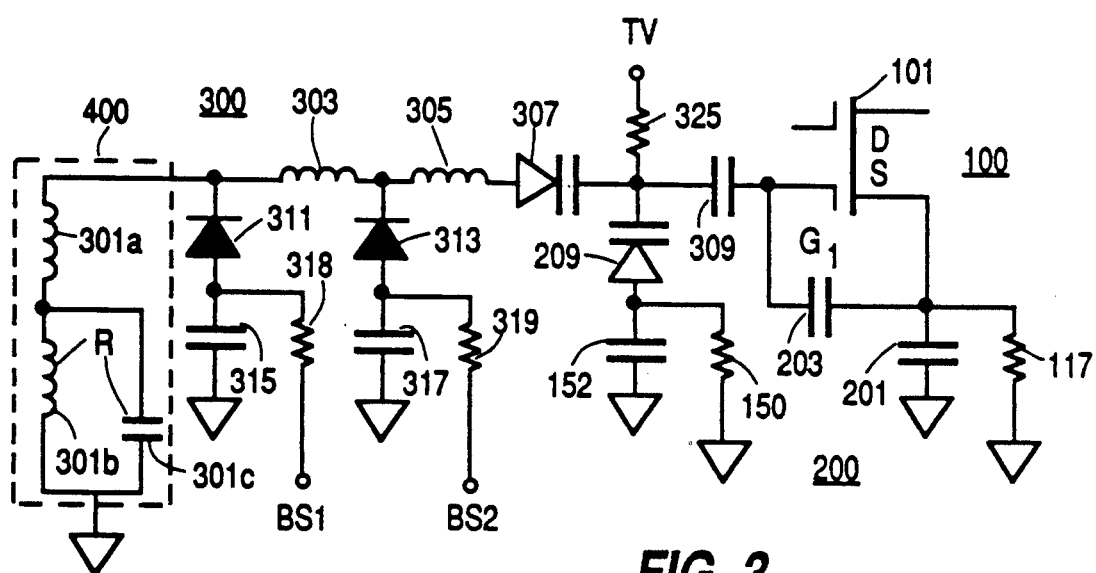
FIG. 3 is a schematic diagram of the oscillator of FIG. 2 modified according to the present invention.

As discussed hereinabove, it is desirable to tailor the transfer characteristic of the oscillator of the change of oscillator frequency vs change in tuning voltage applied to the oscillator for the oscillator to better track the change of tuned signal frequency of the RF signal filters which is determined by a commonly derived tuning voltage. The network 400 of FIG. 3 accomplishes this. The inductor 301 of FIG. 2, which is nominally 500 nHy, in FIG. 3 is split into two series parts, inductor 301a of 200 nHy and inductor 301b of 300 nHy. Inductor 301b is parallel coupled with capacitor 301c of 47 picofarads (pf).

In the exemplary embodiment, for band 1, the oscillator frequency will vary from 101 MHz for channel 2 to 129 MHz for channel 6. Inductor 301b and capacitor 301c of network 400 are form a parallel resonant circuit R which is parallel resonant at 42 MHz. Thus, at the oscillator frequencies of interest in band 1, the oscillator is oscillating at frequencies which are on the high frequency side of the resonant frequency of resonant circuit R and thus, resonant circuit R presents a circuit reactance which is capacitive. However, the amount of capacitive reactance does not change linearly with frequency but instead changes according to the commonly available reactance curves for a tuned circuit. Because the capacitive and inductive reactances are of opposite signs from each other, the capacitive reactance of parallel resonant circuit R being above its parallel resonant frequency subtracts from the inductive reactance of inductor 301a in a non-linear manner vs change in frequency of oscillation.

Thus, the frequency change of the oscillator for a given change in tuning voltage applied to the oscillator is tailored or changed as desired. In the exemplary embodiment, the reactive impedance of network 400 is 136 nHy inductive at 101 MHz and is 163 nHy inductive at 129 MHz instead of 173.7 nHy which would be the linear increase of inductive reactance of an a 136 nHy inductor at 129 MHz. In this manner, the oscillation frequency of the oscillator can be tailored with respect to the change of tuning voltage in a manner which is non-linear with respect to change of tuning voltage inasmuch as a given change in tuning voltage will cause the oscillator frequency to change less than it normally would otherwise change.

Network 400 in the exemplary embodiment is shown as including parallel resonant circuit R. It is within the contemplation of the present invention that a series resonant circuit can be used. One such alternative embodiment (not shown) would be for inductor 301a to be 209 nHy, inductor 301b to be zero nHy (i.e., removed from the circuit), and capacitor 301c being 34 pf. In this configuration, the nonlinear change of inductive reactance of network 400 with frequency will have a different shape of curve which can be used if appropriate. However, in this alternative embodiment, provision would have to be made for providing a DC ground return for bandswitching diodes 311 and 313 if the rest of the exemplary oscillator configuration of FIG. 3 is maintained.

Thus, implementation of three point tracking for band 1 as explained hereinabove can be accomplished by tailoring the transfer characteristic of the change of oscillator frequency vs change of tuning voltage for a change of RF signal tuning circuits, all having a commonly derived tuning voltage.

The tuning reactance of a tuning reactor can just as well be non-linearly changed vs frequency by using the tuned circuit R below resonance, in which case the reactive impedance of the tuned circuit, whether parallel or resonant tuned, will be inductive. Thus resonant circuit R resonant above the oscillator band of interest, can be used below resonance to either add inductive reactance to the inductive reactance of a tuning inductor, or to subtract inductive reactance from the capacitive reactance of a tuning capacitor.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed is:

1. In a television receiver tuner, an oscillator having a tailored tuning response comprising:
   an amplifying device having a conduction path terminated in first and second electrodes and a control electrode for controlling the condition of said conduction path,
   a capacitive feedback path coupled between said first electrode and said control electrode for conditioning said amplifying device to oscillate,
   tuning control means for generating a tuning voltage,
   a first inductive element and a first varactor diode responsive to said tuning voltage coupled in series between said control electrode and a point of reference potential,
   output means for developing an output signal of said oscillator at said second electrode, and
   tailoring means comprising a second inductive element coupled with a capacitance element forming a reactance network, said reactance network coupled with said first inductive element for tailoring the frequency of oscillation vs tuning voltage transfer characteristic of said oscillator.

2. In a television receiver tuner for tuning channels, apparatus comprising:
   channel selection apparatus for generating a tuning voltage having magnitudes of voltage corresponding to selected channels,
   a local oscillator for generating a local oscillator signal at a frequency substantially determined by a tuned circuit having at least one inductor, said frequency being responsive to the selected channel and said tuning voltage,
   RF means for receiving a plurality of RF signals and including filter means controlled in a tracking relationship with said tuned circuit in response to said tuning voltage for selecting one of said RF signals in accordance with the magnitude of said tuning voltage,
   mixer means responsive to said local oscillator signal and to a selected one of said RF signals for generating an IF signal, and
   tailoring means for conditioning said oscillator to change the frequency of oscillation with respect to changes in the magnitude of said tuning voltage, said tailoring means comprising a second tuned circuit coupled to said at least one inductor.

3. The apparatus of claim 2 wherein said tuned circuit comprising at least one inductor and said tailoring means comprises a second inductor in series with said at least one inductor and a capacitor coupled across said second inductor.

4. The apparatus of claim 3 wherein said second inductor and said capacitor are parallel resonant at a frequency different from the tuned oscillator frequency.

5. The apparatus of claim 4 wherein said second inductor and said capacitor are parallel resonant at a frequency below the tuning frequencies of the oscillator.

6. In a television receiver tuner, an oscillator having a tailored tuning response comprising:
   an amplifying device having a conduction path terminated in first and second electrodes and a control electrode for controlling the conduction of said conduction path,
   a first capacitance element coupled between said control electrode and said first electrode,
   a second capacitance element coupled between said first electrode and a point of reference potential,
   said first and second capacitance elements conditioning said amplifying device to oscillate,
   tuning control means for generating a tuning voltage,
   a first inductive element and a first varactor diode responsive to said tuning voltage coupled in series between said control electrode and said point of reference potential,
   a second varactor diode also responsive to said tuning voltage and a third capacitance element coupled between said control electrode and said point of reference potential, said second varactor diode being poled to exhibit the same sense of capacitance change in response to changes of magnitude of said tuning voltage as said first varactor diode,
   output means for developing an output signal of said oscillator at said second electrode, and
   tailoring means comprising a second inductive element coupled with a fourth capacitance element forming a reactance network, said reactance network coupled with said first inductive element for tailoring the frequency of oscillation vs tuning voltage transfer characteristic of said oscillator.

7. The apparatus of claim 6 wherein said second inductive element is coupled in series with said first inductive element and said fourth capacitive element is coupled across said second inductive element.

8. The apparatus of claim 7 wherein said second inductive element and said fourth capacitive element are parallel resonant at a frequency different from the tuned oscillating frequency.

9. The apparatus of claim 8 wherein the second inductive element and said fourth capacitive element are parallel resonant at a frequency below tuning frequencies of the oscillator.

10. In a television receiver tuner, an oscillator having a tailored tuning characteristic comprising:
   an amplifying device,
   feedback and tuning means for conditioning the amplifying device to oscillate at frequencies determined by a tuning means in response to a tuning voltage, said tuning means comprising a reactive tuning element, and
   a resonant circuit coupled to said reactive tuning element for tailoring the response of the tuning means to said tuning voltage, said reactive tuning element being a first inductive element and said resonant circuit being a second inductive element coupled in parallel with a capacitance element forming a network.

11. The apparatus of claim 10 wherein said network is coupled in series with said first inductive element.

* * * * *